United States Patent [19]

Edelman

[11] Patent Number: 5,694,934
[45] Date of Patent: Dec. 9, 1997

[54] MR STUDIES IN WHICH A PARAMAGNETIC GAS IS ADMINISTERED TO A LIVING PATIENT

[75] Inventor: Robert R. Edelman, Brookline, Mass.

[73] Assignee: Beth Israel Hospital, Boston, Mass.

[21] Appl. No.: 633,982

[22] Filed: Apr. 17, 1996

[51] Int. Cl.[6] .................................................. A61B 5/055
[52] U.S. Cl. .......................... 128/653.4; 128/653.2; 128/654; 128/716; 424/9.3
[58] Field of Search ........................... 128/653.1, 653.2, 128/653.4, 654, 716; 324/307, 309; 424/9.3, 9.4, 9.1

[56] References Cited

PUBLICATIONS

*Magnetic Resonance in Medicine*, vol. 33, pp. 271–275 (1995), 'MR Imaging with Hyperpolarized $^3$He Gas', Hunter Middleton et al.
*Radiology 1992*, vol. 183, pp. 667–672, 'Contrast–enhanced MR Imaging of the Lung: Assessments of Ventilation and Perfusion[1]', Berthezene, MD et al.
*Nature*, vol. 370, pp. 199–200 (1994), 'Biological magnetic resonance imaging using laser–polarized $^{129}$Xe', M.S. Albert et al.
*CT*, vol. 5, No. 6, pp. 543–546 (1981), 'Enhancement of Relaxation Rate with Paramagnetic Contrast Agents in NMR Imaging', I.R. Young, Ph.D. et al.

*Primary Examiner*—Marvin M. Lateef
*Assistant Examiner*—Eleni Mantis Mercader
*Attorney, Agent, or Firm*—Mark H. Jay

[57] ABSTRACT

A paramagnetic gas such as oxygen is administered twice at different concentrations to a living patient, as by causing the patient to breathe air and causing the patient to breathe pure oxygen. Two T1-weighted MR images are then acquired of a region in which the gas is present; advantageously, the region includes the patient's lungs. Because the paramagnetic gas shortens the T1 relaxation time of e.g. the patient's lung tissue, a comparison of the T1-weighted MR images shows where the gas has reached the patient's lung tissue and where the gas has been prevented from reaching the patient's lung tissue. This permits the radiologist to carry out e.g. a ventilation study without administering a radioactive material to the patient.

7 Claims, 2 Drawing Sheets

1

MR STUDIES IN WHICH A PARAMAGNETIC GAS IS ADMINISTERED TO A LIVING PATIENT

BACKGROUND OF THE INVENTION

The invention relates to body cavity studies, and more particularly relates to in vivo lung studies. In its most immediate sense, the invention relates to lung ventilation studies of a living patient.

A lung ventilation study is carried out to identify lung pathologies or to rule them out. In some kinds of lung pathologies such as asthma or lung tumors, the airways within the lungs may become blocked off. As a result, air fails to reach certain regions of the lungs during respiration. This diminishes the surface area of the lung that is exposed to the air, thereby diminishing the rate at which oxygen is transferred to the bloodstream and diminishing the ability of the patient to exercise and otherwise function normally.

Conventionally, lung ventilation studies are conducted to determine whether such airway blockages exist in the patient's lungs. In such studies, the patient is induced to breathe a radioactive gas (such as Xe). Then, a nuclear medicine study is carried out in a scintillation camera to form an image of the patient's lungs.

Because the gas travels throughout the open parts of the patient's lungs and cannot reach the blocked-off regions, the presence of the gas at a particular location means the location is open to entering air and the absence of the gas at a particular location means the location is blocked off to entering air. Because the gas is radioactive and radioactivity-emitting regions form a nuclear medicine image, the image formed by the scintillation camera shows where the gas is present and where the gas is absent. In this way, the existence (and extent, if any) of airway blockages in the patient's lungs can be determined.

Another conventional methodology for conducting a lung ventilation study utilizes magnetic resonance (MR) imaging technology. In this alternate methodology, the patient inhales a suspension of air and a paramagnetic substance such as Gd-DTPA. Because Gd is paramagnetic, the Gd compound shortens the T1 relaxation time of the lung tissue with which it comes into contact. As a result, a T1-weighted MR image of the patient's lungs will show where the Gd compound has been deposited on the patient's lung tissue. Where the Gd compound is present, the airway is open; where the Gd compound is absent, the airway is blocked off.

These conventional methodologies suffer from certain disadvantages. Xe and Gd are expensive, Xe is toxic, and inhalation of Gd-containing aerosols is not presently an FDA-approved procedure. It would be advantageous if the use of such materials could be curtailed. Furthermore, conventional Xe methodology suffers from poor spatial resolution and from artifacts caused by attenuation in soft tissues that overlie the lungs.

It would therefore be advantageous to provide a method for conducting a body cavity study, and particularly a lung ventilation study, that did not use expensive or toxic agents such as Xe and Gd.

The invention proceeds from the realization that the enormous surface area inside a patient's lungs can amplify the known weak paramagnetic characteristics of oxygen gas. More particularly, it has long been known that oxygen is slightly paramagnetic, and that the paramagnetism of inhaled oxygen gas can slightly reduce the T1 relaxation time of the blood in the heart. When a pure supply of oxygen is administered to a patient's respiratory system (as by delivering the gas to the patient via a facemask), a large quantity of oxygen is transferred to the lung tissue in regions where the oxygen reaches the surface of the lung. This in turn so reduces the T1 relaxation time of the lung tissue that a T1-weighted MR image can distinguish between oxygenated lung tissue and nonoxygenated lung tissue.

In accordance with the invention, a paramagnetic gas is twice introduced—at different concentrations—into the body cavity of a living patient. After each such introduction, a T1-weighted MR image is acquired of the body cavity. Advantageously, the paramagnetic gas is oxygen, the oxygen is breathed into the patient's lungs, and the T1-weighted MR images are acquired of at least one of the lungs.

In the preferred embodiment, acquisition of the T1-weighted image is accomplished using an MR pulse sequence that is insensitive to magnetic field inhomogeneities in the region to be imaged. Advantageously, the pulse sequence has a short echo time; in the preferred embodiment, the pulse sequence is of the turbo spin echo type.

BRIEF DESCRIPTION OF THE DRAWINGS

The invention will be better understood with reference to the following illustrative and non-limiting drawings, in which.

DETAILED DESCRIPTION OF PREFERRED EMBODIMENTS

The description below is specific to a particular application, namely, a lung ventilation study carried out upon a living human being. However, the study need not be a lung ventilation study and the subject need not be a human being.

In accordance with the preferred embodiment of the invention, two T1-weighted images of the patient's lungs are compared. One T1-weighted image (the "air image") is acquired while the patient breathes air, and the other T1-weighted image (the "oxygen image") is acquired while the patient breathes pure oxygen. The air image establishes a baseline for the MR signal, and the oxygen image shows where the airways in the patient's lungs are unobstructed. A comparison of the air image and the oxygen image permits the diagnostician to determine where the airways are open and where they are blocked.

The (human) patient is placed within an MR imager and is given a facemask. In an initial step, the facemask is supplied with air and a T1-weighted image is acquired (using the MR pulse sequence illustrated in FIG. 2) while the patient breathes the air. Thereafter, the mask is supplied with pure oxygen gas at slightly above atmospheric pressure. The patient then breathes the oxygen for e.g. several seconds to several minutes. (Typically, thirty seconds to one minute of pure oxygen is sufficient to perfuse the unobstructed regions of the patient's lungs.) Another T1-weighted image of the patient's lungs is then acquired using the same MR pulse sequence.

The oxygen image distinguishs between lung regions that have been exposed to oxygen and those that have not, because the MR signal from aerated regions increases from exposure to oxygen, whereas the MR signal from nonaerated regions does not increase. As a result, a comparison of the air image and the oxygen image shows where the lungs are open and where the lungs are not.

Figure 1:
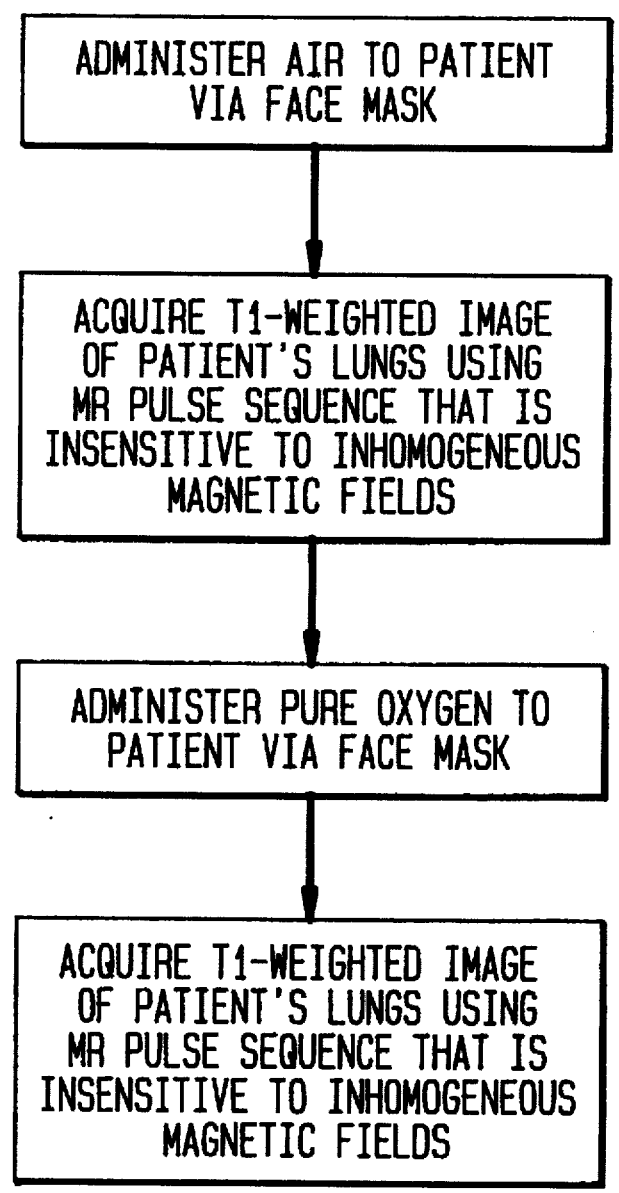
FIG. 1 is a flowchart of a preferred embodiment of the invention.
Figure 2:
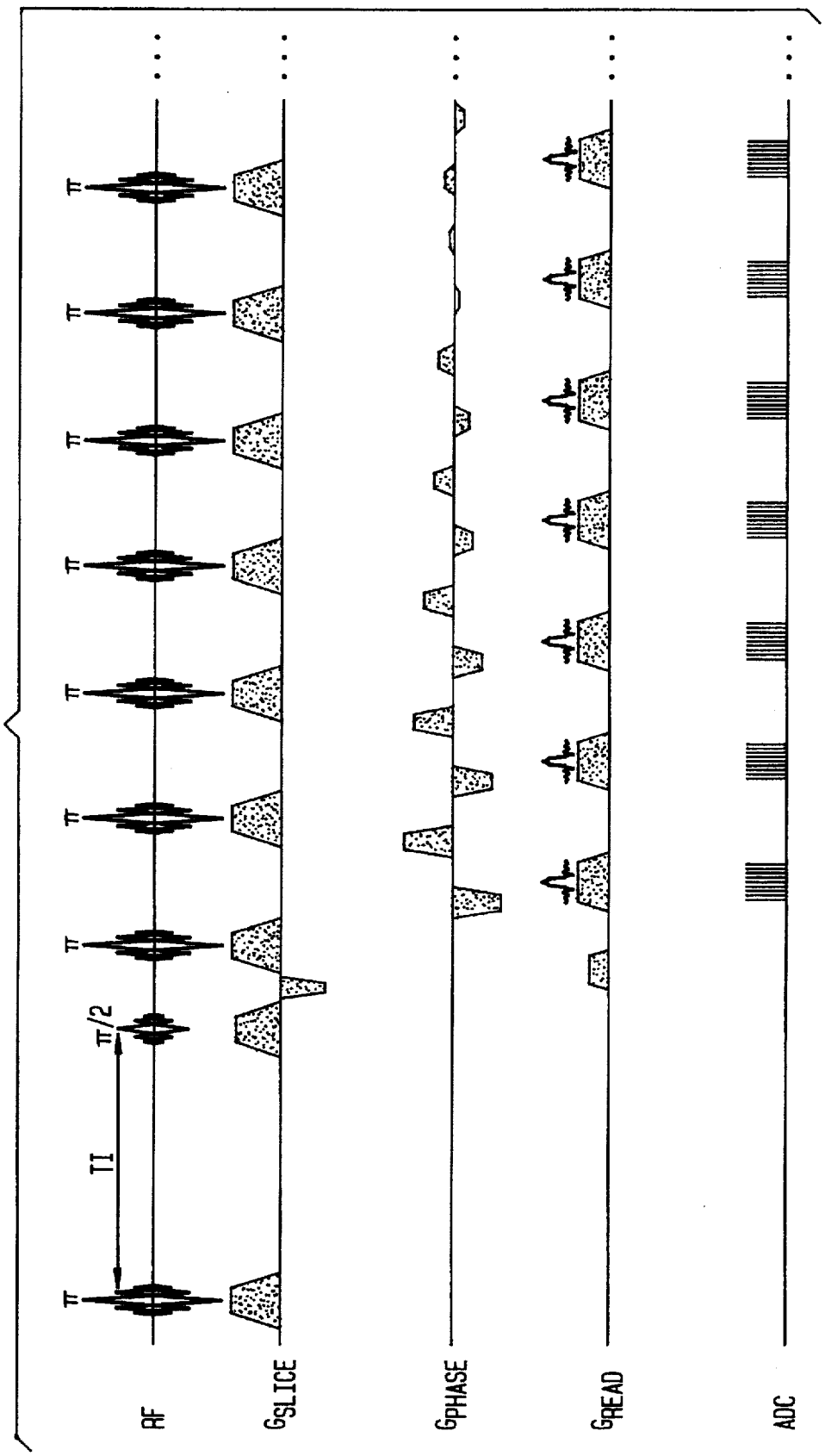
FIG. 2 is a diagram showing an MR pulse sequence in accordance with the preferred embodiment.

In accordance with the preferred embodiment, the MR pulse sequence used should be insensitive to magnetic field inhomogeneities, because the magnetic field within the lungs is not homogeneous. Suitable sequences are gradient echo sequences with very short echo times, spin echo signals, or turbo spin echo sequences such as is illustrated in FIG. 2. This FIG. 2 sequence may be regarded as a turbo spin echo sequence following an initial 180° (inversion) RF pulse. After a suitable time TI, a 90° excitation pulse is followed by a train of refocussing pulses, each giving rise to a spin echo. The spin echoes are all separately phase-encoded, and the effective echo time is determined by the echoes having a low spatial frequency.

Although administration of oxygen gas and indeed pure oxygen gas is preferred, this is not necessary. Any other paramagnetic gas can be used instead. Furthermore, as long as the oxygen is administered at a partial pressure exceeding the partial pressure of oxygen in the atmosphere, the necessary intensification of the image of the oxygenated lung tissue will occur. Administration of pure oxygen has the advantage that the study is shortened.

Although in the preferred embodiment the air image is acquired first and the oxygen image afterward, this is not necessary. The oxygen image may alternatively be acquired first. If this alternate procedure is used, there must be sufficient time between acquisition of the oxygen image and acquisition of the air image that the patient's lungs have been purged of the pure oxygen and are filled exclusively with air.

So, too, although it is preferred to use an MR pulse sequence that is insensitive to magnetic field inhomogeneities within the patient's lungs, this is also not required. It has the advantage of reducing the sensitivity of the MR image to inhomogeneity artifacts.

Although a preferred embodiment has been described above, the scope of the invention is limited only by the following claims.

I claim:

1. A method of obtaining MR images for use in conducting a ventilation study, comprising the following steps performed in order:

causing the patient to breathe a paramagnetic gas at a predetermined concentration;

acquiring a T1-weighted MR image of said at least one lung;

causing the patient to breathe the paramagnetic gas at a different concentration; and acquiring another T1-weighted MR image of said at least one lung.

2. The method of claim 1, wherein the gas is pure oxygen.

3. The method of claim 1, wherein said acquiring steps are carried out using identical MR pulse sequences.

4. The method of claim 3, wherein the MR pulse sequence has a short echo time.

5. The method of claim 4, wherein the MR pulse sequence is of the turbo spin echo type.

6. The method of claim 3, wherein said MR pulse sequence is insensitive to magnetic field inhomogeneities existing within said at least one lung.

7. A method of conducting an MR study of a region of a living patient, which region includes a body cavity, comprising the following steps performed in order:

introducing a paramagnetic gas at a predetermined concentration into said body cavity;

acquiring a T1-weighted MR image of said region;

introducing the paramagnetic gas into the body cavity at a different concentration; and acquiring another T1-weighted MR image of said region.

* * * * *